United States Patent [19]

Derbenwick et al.

[11] 4,397,077
[45] Aug. 9, 1983

[54] METHOD OF FABRICATING SELF-ALIGNED MOS DEVICES AND INDEPENDENTLY FORMED GATE DIELECTRICS AND INSULATING LAYERS

[75] Inventors: Gary F. Derbenwick; James R. Adams; Matthew V. Hanson; William D. Ryden, all of Colorado Springs, Colo.

[73] Assignee: Inmos Corporation, Colorado Springs, Colo.

[21] Appl. No.: 331,475

[22] Filed: Dec. 16, 1981

[51] Int. Cl.³ .......................................... H01L 21/76
[52] U.S. Cl. ................................... 29/571; 29/576 B; 29/577 C; 29/591; 148/1.5; 357/49
[58] Field of Search ................. 29/571, 576 B, 577 C, 29/589, 591; 148/1.5, 188; 365/184; 357/23 C, 23 S, 49, 51, 59, 23 VT

[56] References Cited

U.S. PATENT DOCUMENTS 4,027,381  6/1977  Tasch, Jr. et al. .................... 29/578
4,234,362  11/1980  Riseman ............................. 357/24 X
4,287,661  9/1981  Stoffel ................................. 29/571

FOREIGN PATENT DOCUMENTS 55-138278  10/1980  Japan ................................. 365/184

Primary Examiner—L. Dewayne Rutledge
Assistant Examiner—Alan E. Schiavelli
Attorney, Agent, or Firm—Cook, Wetzel & Egan

[57] ABSTRACT

A method is described for fabricating MOS devices of the type found in very large scale integrated circuits. According to the method described herein, various gate oxides and insulating layers are fabricated independently of each other in order to independently tailor their thicknesses and thereby provide improved isolation between gate electrodes and interconnects, and independently controllable operating characteristics for multiple gate electrode structures. The fabrication of a dynamic RAM memory cell, an overlapping gate CCD device and a self-aligned MNOS transistor cell are described using the disclosed method.

23 Claims, 14 Drawing Figures

METHOD OF FABRICATING SELF-ALIGNED MOS DEVICES AND INDEPENDENTLY FORMED GATE DIELECTRICS AND INSULATING LAYERS

BACKGROUND OF THE INVENTION

This invention is directed generally to improvements in the fabrication of semiconductor devices. It is particularly directed to the provision of improved isolation between a gate electrode and subsequent interconnect or gate levels and fabrication of adjacent, self-aligned transistors having independently formed gate dielectrics.

Conventional fabrication techniques frequently result in the inability to consistently provide adequate electrical isolation between a gate electrode and other subsequently formed gate electrodes or interconnects. Conventional attempts to improve such isolation have had limited success, principally because isolation oxides between various gate electrodes or interconnects are formed simultaneously with the formation of gate oxides. The simultaneous formation of the isolation and gate oxides prevents their being treated independently, even though they have independent requirements as to thickness and/or other characteristics. Typical of such conventional techniques is that described in the article entitled "Intermediate Oxide Formation in Double-Polysilicon Gate MOS Structure" in Volume 127, No. 11, of the Journal of the Electrochemical Society: Solid-State Science and Technology (November 1980).

Because of the foregoing problems, it has been difficult to consistently fabricate self-aligned transistor structures, such as where the gate dielectrics have different structures or are made of different materials.

OBJECTS OF THE INVENTION

It is a general object of the invention to provide an improved fabrication technique for MOS devices.

It is a more specific object of the invention to provide a fabrication technique for forming improved isolation layers between gate electrodes and between one or more gate electrodes and subsequently formed interconnects.

It is another object of the invention to provide a fabrication technique in which isolation oxides are formed independently of gate oxides or dielectrics.

It is a further object of the invention to provide a fabrication technique for forming adjacent, self-aligned transistors with independently controllable gate dielectrics.

BRIEF DESCRIPTION OF THE FIGURES

The objects stated above and other objects of the invention are set forth more particularly in the following detailed description and in the accompanying drawings, of which.

DESCRIPTION OF THE PREFERRED EMBODIMENT

The fabrication methods described below are useful in the fabrication of various types of structures which include isolation between gate electrodes or between one or more gate electrodes and subsequently formed interconnects. The memory cell structure of a dynamic RAM is one example of a structure which is advantageously fabricated by the present method. Other applications of the present method include the fabrication of multiple gate devices of the type used in CCD's (Charge Coupled Devices) and MNOS (Metal-Nitride-Oxide Semiconductor) transistor cells. The use of the method to fabricate a memory cell structure for a dynamic RAM is described first.

Figure 1:
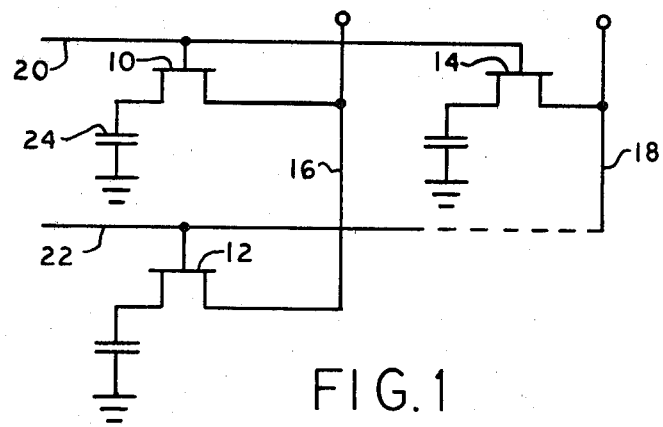
FIG. 1 shows a typical memory cell array of a dynamic RAM to illustrate one type of memory cell which may be fabricated according to the invention.

To make explicit one type of structure which may be fabricated by the present method, reference is made to FIG. 1. This Figure shows the typical type of arrangement used in dynamic RAMs wherein exemplary access transistors 10, 12 and 14 are coupled to bit lines 16 and 18 and to word lines 20 and 22. In response to selection by potentials on the bit lines and word lines, access transistor 10, for example, couples its memory cell capacitor 24 to the bit line 16. This operation is well known to those skilled in the art and need not be more fully described. The method described below explains how any of the access transistors and their associated memory cell capacitors are preferably fabricated so as to better isolate the memory cell capacitor from its bit line. With the improved isolation, fluctuations in the potential on bit lines do not substantially alter the potential on cell capacitors.

Figure 2:
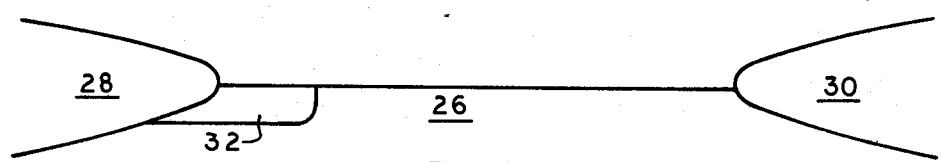
FIGS. 2 through 7 illustrate various steps in the fabrication of the type of memory cell shown in FIG. 1.

Referring now to FIG. 2, the memory cell capacitor and its access transistor may be formed on a substrate 26 in which field oxide regions 28 and 30 are established conventionally, for example, using local oxidation techniques. An arsenic implant region 32 for the memory cell capacitor is formed in the substrate using conventional techniques.

Figure 3:
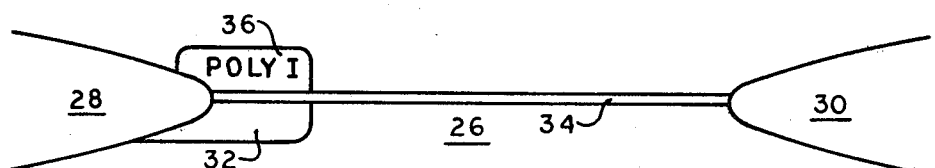

Next, a gate oxide 34 (FIG. 3) is grown over the substrate. Typically, the thickness of this gate oxide is in the range of from 15 to 40 nanometers. Over the oxide 34 (over the implant 32), gate material, such as polysilicon, for example, is deposited and defined to provide a Poly I gate 36. This gate may be defined by using conventional photolithographic techniques.

Figure 4:
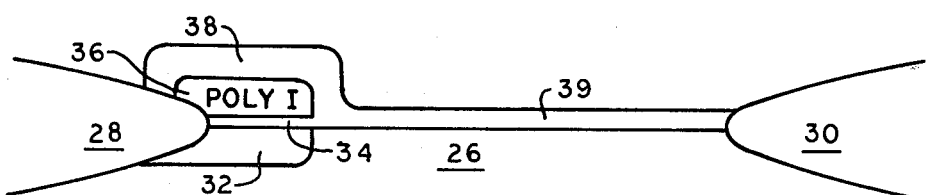

Referring now to FIG. 4, an isolating layer 38, preferably of oxide, is grown over the Poly I and in the region of oxide 34. Preferably, the oxide layer 38 is grown differentially as described in U.S. application Ser. No. 331,474 filed on even date herewith so that the oxide 38 over the Poly I achieves a greater thickness than the oxide 39 which remains over the substrate and results from the growth of oxides 34 and 38. Such differential growth is made possible because the oxide grows thicker over the Poly I than over the substrate.

Figure 5:
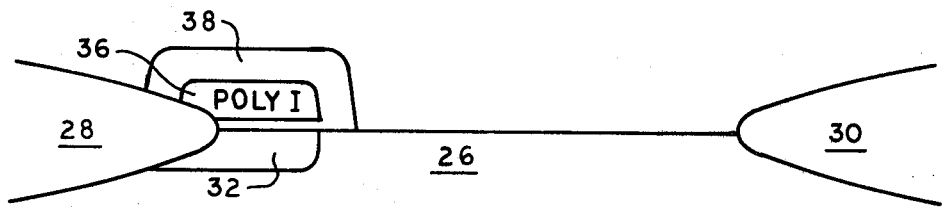

Next, the oxides 38 and 39 are anisotropically etched, as by using the plasma etch described in the above-mentioned patent application. This etch preferably removes the oxide 39 to lay bare the substrate, and leaves oxide 38 over the top and sides of Poly I, as shown in FIG. 5. The oxide 38 which covers the Poly I gate may be thinned by this etching but, because of its greater thickness over the Poly I, a substantial portion of it remains.

The oxide 38 on the sidewall of the Poly I gate is usually not thinned substantially because of the anisotropic nature of the etch.

In the case where differential growth is not practical, the structure of FIG. 4 may be realized by first forming a layer of gate electrode material over the gate dielectric 34. Then another dielectric is formed over the gate electrode material. The gate electrode material and the latter dielectric are then removed, as by etching, to leave a defined gate electrode whose top is covered by dielectric. Another layer of dielectric may be formed over the entire structure to provide the geometry shown in FIG. 4. The two dielectrics on top of the gate electrode provide adequate thickness for proper isolation after anisotropic etching has been effected.

Figure 6:
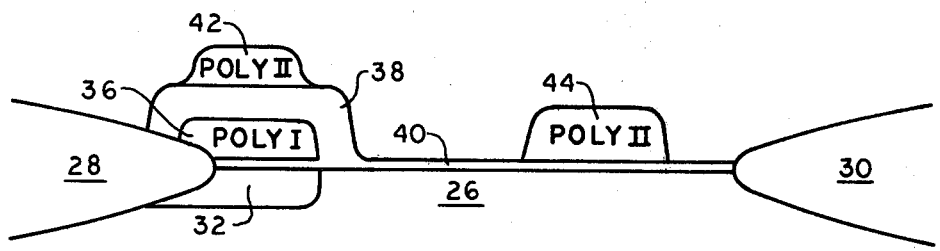

Referring to FIG. 6, a gate oxide 40 is then grown to a thickness of about 40 nanometers, for example. During such growth, the thickness of the oxide 38 may increase by about 10 nanometers.

Following the growth of the gate oxide 40, polysilicon is deposited and defined to form a Poly II interconnect 42 over the oxide 38 and a Poly II gate 44 over the oxide 40. The latter gate corresponds to the gate electrode of the access transistor, and the Poly II gate 42 is in an interconnect to a bit line. The memory cell capacitor is formed between the Poly I gate 36 and the implanted layer 32.

Figure 7:
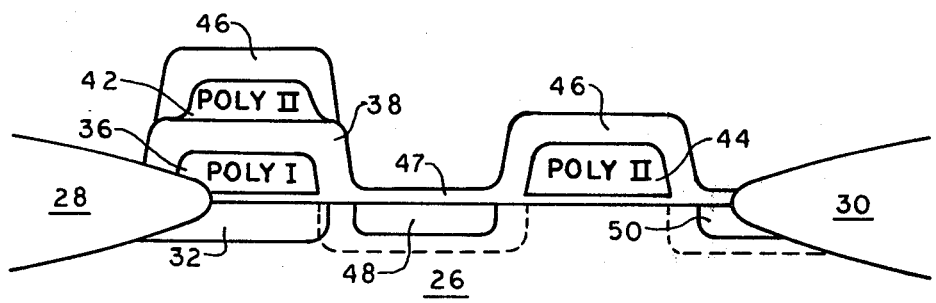

Referring to FIG. 7, another oxide 46 is differentially grown over the structure such that this oxide 46 has a greater thickness over Poly II levels 42 and 44 than oxide 47 over the substrate. The oxide 47 over the substrate is a combination of oxides 40 and 46 and has a thickness of about twice the thickness of the oxide 40 in FIG. 6 where the latter oxide overlies the substrate.

To provide source/drains for the access transistor, source/drain regions 48 and 50 are implanted as described in the above-mentioned patent application such that the sides of these regions are substantially vertically aligned with the corresponding edges of the oxide 46 surrounding the gates 36 and 44. The structure is then heat treated to drive the source/drain regions into the substrate and laterally until the edges of the source/drain regions are in substantial vertical alignment with the corresponding edges of gates 36 and 44. The dashed lines in FIG. 7 illustrate the positions of the source/drain regions after the heat treatment.

A primary advantage of this fabrication method is that oxides 38 and 40 (see FIG. 6) are grown separately. Hence, the thickness of the oxide 38 is controllable independently of the growth of oxide 40 to make the oxide 38 thick enough to provide good isolation between the Poly I 36 and the Poly II interconnect 42. Thus, fluctuations in the potential on the bit line do not cause substantial coupling to the memory capacitor via the bit line interconnect 42.

In addition, the thickness and material of the oxide between the substrate and gate 36 (see FIG. 7) may differ from the thickness and material of the oxide 47 which covers the substrate. Thus, a higher capacitance memory cell can be fabricated by causing the oxide under the gate 36 to be thinner than the oxide 47 which covers the rest of the substrate and the oxide under access gate 44.

Those skilled in the art will appreciate that the source/drains 48 and 50 have been self-aligned. When such alignment is not desired, the oxide 46 need not be formed over the gate 44 prior to implantation of the source/drain regions.

Figure 8:
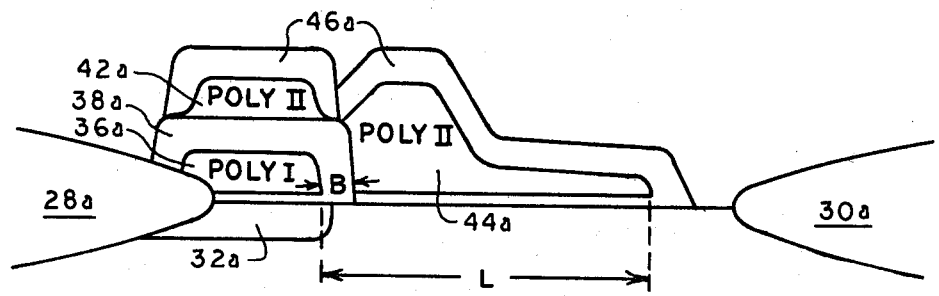
FIG. 8 illustrates how an MOS device may be made with overlapping gate electrodes.

Another variation of the present method contemplates that the gates 36 and 44 may be overlapping rather than separated as shown in FIG. 7. Referring to FIG. 8 wherein structure which corresponds to the structure of FIG. 7 has a corresponding reference numeral followed by the character "a", an MOS device is shown which has overlapping gates and which is fabricated using the previously described method. The illustrated MOS device includes a Poly II gate 44a which overlaps the Poly I gate 36a. With this type of structure, the distance L may undesirably vary due to misalignment of a mask in the formation of the gate 44a but a smaller cell can be fabricated. However, the separation between gates 36a and 44a is defined by the thickness of the oxide 38a on the gate 36a (dimension B). Thus, self-alignment between gates 36a and 44a is provided and, because the thickness of the oxide 38a is independently controlled, the separation and isolation between gates 36a and 44a is likewise controlled.

Figure 9:
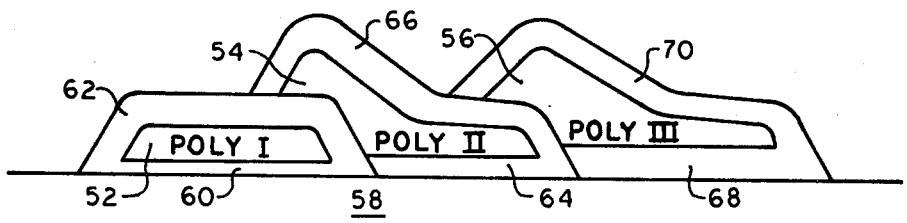
FIG. 9 illustrates a charge coupled device fabricated according to the invention.

The use of overlapping gates and their previously described method of fabrication also finds use in the construction of adjacent, self-aligned CCD (Charge Coupled Device) gates. As shown in FIG. 9, three adjacent and overlapping polysilicon gates 52, 54 and 56 are formed over a substrate 58. These gates may be formed as follows. First, a gate oxide 60 is grown over the entire substrate. The Poly I material is then deposited over the oxide and patterned conventionally to form the gate 52.

An oxide 62 is then grown differentially as described above over the entire structure, after which this oxide is anisotropically etched so that the illustrated pattern of oxide 62 remains and the rest of the substrate is laid bare.

Another layer of gate oxide 64, of perhaps different thickness from the oxide 60, is grown over the bare substrate. Then the gate 54 is formed as described previously for the gate 52. Another insulating oxide 66 is differentially grown and anisotropically etched (as described with reference to the oxide 62) to form the illustrated pattern of oxide 66.

Next, another gate oxide 68, of perhaps different thickness from oxide 64, is grown, the gate 56 and another oxide pattern are formed in the manner described above. Because the various oxides are independently formed, their thicknesses may be controlled to provide the required degree of isolation and separation between adjacent gates. In addition, the direction of charge flow between potential wells under the gates is controlled by varying the thickness of adjacent gate oxides, as those skilled in the art can appreciate. This result is made possible because all such gate oxides are independently grown.

Independent formation of various materials also provides advantages for other types of devices such as MNOS transistor cells. The preferred steps for fabricating such a transistor cell are now described.

Figure 10:
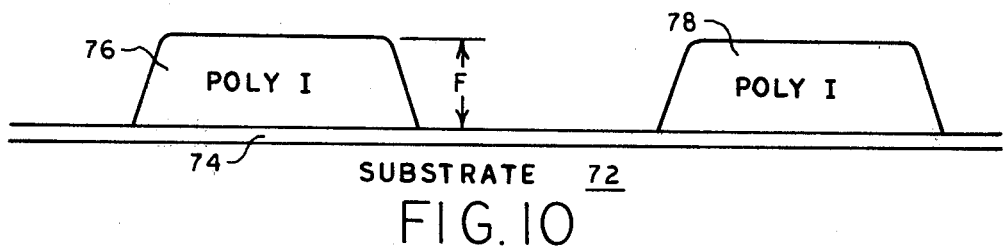
FIGS. 10 through 14 illustrate various steps in the fabrication of an MNOS memory transistor cell according to the invention.

Referring to FIG. 10, the intended MNOS transistor 16 is fabricated on a substrate 72 which may be p-type silicon. Over the substrate, a thin insulating layer of gate oxide 74 is grown to a thickness of about 50 nanometers, for example. Optionally, a thin nitride may be deposited on the gate oxide to improve its integrity.

Next, a Poly I layer is deposited, heavily doped (approximately 20 ohms per square), and conventionally pattern-etched to define a pair of Poly I gate electrodes 76 and 78. Each of these electrodes may have a thickness (dimension F) of about 600 nanometers. The next step establishes a relatively thick oxide layer over the tops and sides of the gate electrodes and a relatively thinner oxide layer over the substrate in the areas of intended source/drain regions.

Figure 11:
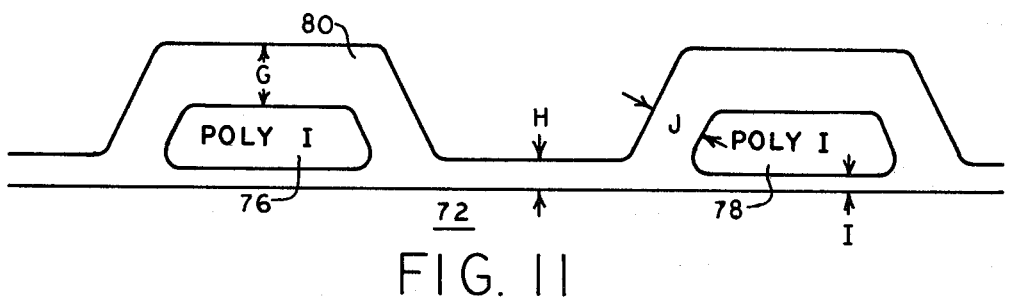

The last mentioned step is effected by growing oxide over the Poly I at temperatures and over times which are selected to maximize the differential growth of oxide over the Poly I, on the one hand, and the gate oxide 74, on the other hand. This is preferably achieved by using steam oxidation at about 850° C. until the thickness of the gate oxide 42 increases by about 120 nanometers and the thickness of the oxide over the Poly I gates grows to about 500 nanometers. This result is shown in FIG. 11 where the oxide layer 80 represents the oxide just grown on Poly I and the resulting oxide (including the gate oxide) over the substrate. Thus, the thickness of the oxide over the Poly I gates is about 500 nanometers (dimension G), its thickness over the substrate is about 170 nanometers (dimension H), its thickness under the Poly I is about 50 nanometers (dimension I), and its thickness on the sides of the Poly I is about 500 nanometers (dimension J).

Figure 12:
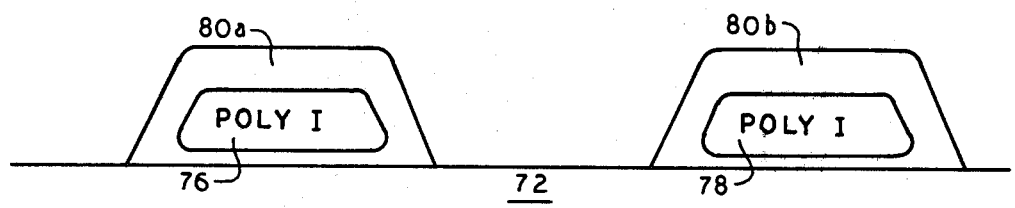

Next, the structure shown in FIG. 11 is anisotropically etched until the substrate is exposed. Such etching may be accomplished by a plasma etch. The result is shown in FIG. 12 wherein the oxide layers (80a and 80b) on the tops and sides of the Poly I gates have been reduced to a thickness of about 300 nanometers.

The latter etching step has been found to provide a good taper on the walls of the Poly I gates over the substrate and permits good step coverage (no re-entrant angle) in subsequent fabrication steps. Also, the Poly I is passivated on its sides and top by the oxides 80a and 80b. This will allow self-alignment of a memory gate with the Poly I gates as discussed below. Optionally, at this point the memory gate area between the Poly I access gates can be protected by photoresist, for example, and the source/drain regions implanted. However, in the preferred process, the source/drain regions are implanted after the Poly II gate is defined, as described below.

To construct a memory gate, a layer of tunnel oxide 82 ($SiO_2$) is conventionally grown to a thickness of about 2 to 3 nanometers as by using dry oxidation. In addition, a memory quality nitride 84 ($Si_3N_4$) is deposited over the tunnel oxide (FIG. 13) as by using a low pressure chemical vapor deposition reactor. The thickness of the nitride 84 may be from about 20 to 500 nanometers, depending on the write voltage and retention desired. This nitride is then optionally oxidized to provide a layer 86 of $SiO_2$ to prevent charge injection from a Poly II gate which will be formed. Such oxidation may be implemented in steam at about 850° to 900° C. for 2 to 3 hours, typically.

Figure 13:
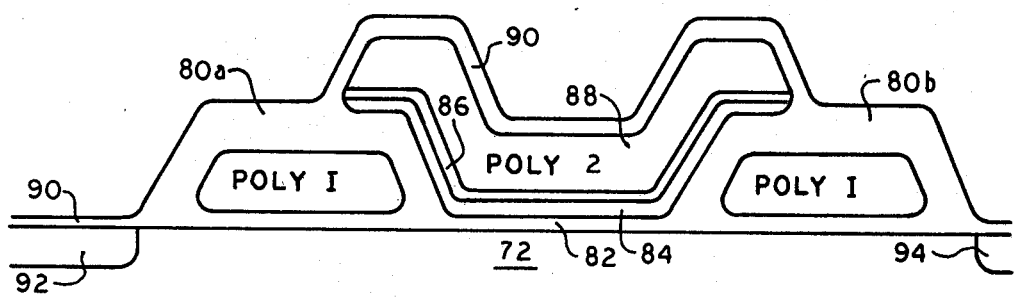

Over the layer 86, a Poly II memory gate electrode 88 is formed by conventionally depositing a layer of Poly II, doping it with an N-type dopant such as phosphorus to a resistivity of about 20 ohms per square, and either dry or wet etching (as with a mask) to remove the unwanted areas of Poly II, the nitride oxide, and the nitride to define the memory gate structure of FIG. 13.

An $SiO_2$ reoxidation is then effected to provide an oxide layer 90 over the Poly II gate and over the substrate 72 where source and drain regions will be formed. The reoxidized layer 90 also grows in the regions of the previously formed oxide layers 80a and 80b, and, in FIG. 13, the latter layers are shown as being thickened.

Such reoxidation may be effected in a steam environment at 800° C. for about 25 minutes.

One of the functions of this reoxidation is to protect the bare silicon substrate during a subsequent source/drain implant. It also optimizes the thickness of the oxide walls on the Poly I so that implanted sources and drains will be closely aligned with the Poly I gates at the conclusion of processing. In addition, the reoxidation provides a thermal oxide over the Poly II to give integrity to an interlevel dielectric which is provided later.

It should be pointed out at this juncture that the layers 82, 84 and 86 have been formed independently of the oxide 48a, 48b. Hence, the oxide 48a, 48b may be made thick to provide good isolation between Poly I and Poly II.

Using the relatively thick oxide layers on the sides of the Poly I gates as a mask, a drain 92 and a source 94 are implanted to a depth of about 0.3 microns using a dosage of about $6 \times 10^{15}$ ions per square centimeter and an energy of about 150 keV. This provides substantial vertical alignment between the oxide on the sides of the Poly I gates and the adjacent edges of the drain and source.

Figure 14:
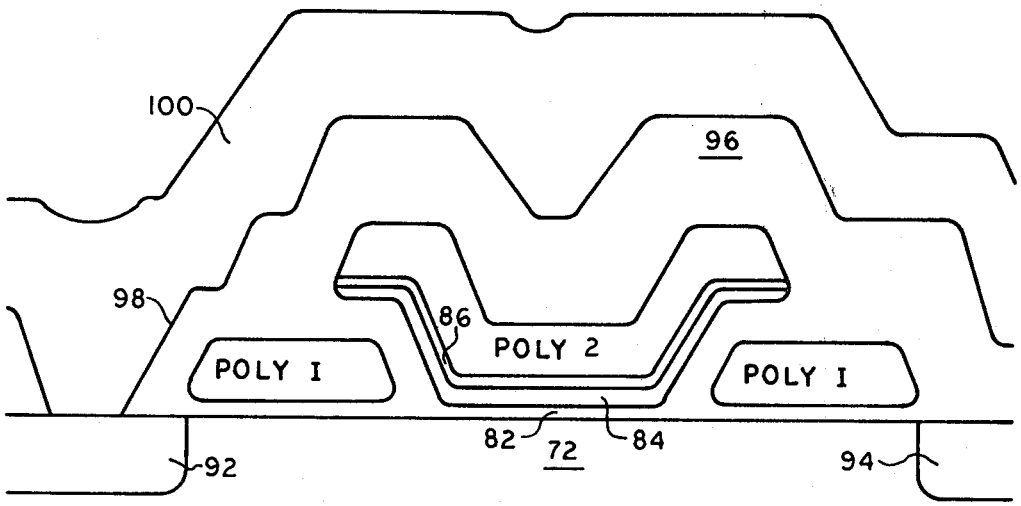

Referring now to FIG. 14, an interlevel dielectric having a thickness of about 900 nanometers is deposited at a temperature of about 450° C. in order to separate the Poly I and Poly II gates from a subsequently applied layer of metallization. The numeral 96 designates the combination of this interlevel dielectric and oxide layers which were previously formed below it.

To improve the adhesion of a subsequently applied photoresist, the layer 96 is preferably densified in steam at a temperature of about 800° C.

By photoresist pattern techniques or the like, contact areas are defined where the interlevel dielectric is to be removed. When those contact areas have been defined, the structure is dry etched anisotropically (as by a plasma etch) to expose the substrate over the drain 92 and to etch back the wall 98 to the previous thickness of the oxide layer 80a. The interlevel dielectric over the source 94 may also be removed but is shown as having not been etched because the illustrated memory transistor preferably shares a common source with other memory transistors on the same chip.

Note that the etched out region overlaps the Poly I gate in order to position a drain contact closer to the Poly I gate and thereby save chip area. Hence, a minimum size gap can be used between the drain contact and Poly I; no larger alignment tolerance is needed as with conventional fabrication techniques.

If the wafer contains other contact windows which were not fully opened during the previous etch (as for contacts to the Poly I and Poly II levels) the window over the wall 98 and the drain 92 may be masked and those other contact windows may be completely etched. This re-etch, if needed, is followed by a glass reflow of the entire wafer at about 1000° C. for 25 minutes to round off all edges and to drive the source and drain regions into alignment with the Poly I and Poly II gates. In FIG. 14, the drain 92 and the source 94 are shown as having been heat driven into this alignment.

After the glass reflow is completed, an aluminum-silicon alloy metallization pattern 100 is deposited, defined (as by masking), and alloyed over the entire wafer to make contact with the areas which were etched out. A metal contact is thus established with the drain region 92, as well as with any other areas, such as the gate electrodes, which were opened in the previous contact etch step.

As those skilled in the art will appreciate, the removal of oxide from the silicon substate by anisotropic plasma etching permits the independent growth of gate oxide. Consequently, the breakdown, leakages and other properties of the Poly II gate may be optimized without sacrificing the integrity of the Poly I-Poly II oxide. It also allows more precise control of the oxide thickness on the Poly I sidewall to eliminate overlap between a Poly I gate and its associated source/drain region.

Although the invention has been described in terms of preferred steps, it will be obvious to those skilled in the art that many alterations and modifications may be made without departing from the invention. By way of example only, the sequence in which some of the steps are practiced may be altered to suit a particular application or processing environment. Many other such changes will be obvious to those skilled in the art. Accordingly, it is intended that all such modifications and alterations be considered as within the spirit and scope of the invention as defined by the appended claims.

What is claimed is:

1. A method of fabricating an MOS device on a substate, comprising:
   (1) forming a first gate dielectric over the substrate; then
   (2) defining a gate electrode over the gate dielectric; then
   (3) establishing a single isolating layer over the gate electrode and in the region of the gate dielectric not covered by gate electrode said isolating layer contacting the top and side surfaces of said gate electrode, said isolating layer being thicker on the top and side surfaces of said gate electrode and thinner on the other regions; then
   (4) anisotropically etching the isolating layer and the gate dielectric from the substrate but leaving at least a substantial portion of the isolating layer on the top and sides of the gate electrode; and then
   (5) establishing a second gate dielectric over the stripped portion of the substrate, whereby the isolating layer and both gate dielectrics are established independently for independently controlling their individual thickness so that subsequently formed components may be properly isolated from the gate electrodes and employ a gate dielectric of a desired thickness.

2. A method for fabricating an MOS device having a substrate, a gate electrode, an isolating layer over the gate electrode, a gate dielectric under the gate electrode, and a gate dielectric on the substrate adjacent the gate electrode wherein the thicknesses of the gate electrode and the two gate dielectrics can be individually and substantially independently controlled, comprising the steps of:
   forming a first gate dielectric over the substrate; then
   defining a gate electrode over the gate dielectric; then
   establishing an isolating layer over the gate electrode and over the gate dielectric not covered by the gate electrode, including differentially thermally growing said layer such that it is relatively thick on the top and sides of the gate electrode and relatively thin over the gate dielectric; then
   anisotropically etching the gate dielectric adjacent the electrode from the substrate but leaving a substantial portion of the isolating layer on the top and sides of the gate electrode; and then
   establishing a second gate dielectric over the portion of the substrate from which the dielectric has been etched, whereby the thicknesses of the gate dielectrics and gate isolating layer are individually controllable.

3. A method as set forth in claim 1 wherein the gate dielectrics are oxides.

4. A method as set forth in claim 1 or 2 including establishing an implant in the substrate to form a distinct, deep layer which forms, with the gate electrode, a memory cell capacitor.

5. A method as set forth in claim 4 including establishing an interconnect over the gate electrode and over the isolating layer, establishing a second gate electrode over the second gate dielectric, and implanting source/drain regions in the substrate to form an access transistor for the memory cell capacitor.

6. A method as set forth in claim 1 or 2 including establishing a second gate electrode over the second gate dielectric such that the latter electrode overlaps the first gate electrode, whereby said isolating layer defines a controlled separation between the first and second gate electrodes.

7. A method as set forth in claim 6 wherein said second gate dielectric is selected to have a different thickness from said first gate dielectric.

8. A method as set forth in claim 7 including establishing third and subsequent gate dielectrics having independently controlled thicknesses, and forming third and subsequent gate electrodes over the gate dielectrics.

9. A method as set forth in claim 1 or 2 for fabricating an MOS memory cell, wherein a pair of gate electrodes are defined over the first gate dielectric, wherein said isolating layer is established over both gate electrodes, wherein a substantial portion of the isolating layer is left on the top and sides of both gate electrodes after the isolating layer has been stripped from the substrate, wherein the second gate dielectric includes a memory quality insulator, and further including:
   forming, above the memory quality insulator, a memory gate between said first and second gate electrodes; and
   implanting source/drain regions in the substrate adjacent the first and second gate electrodes.

10. The method of claim 2 wherein said establishing step consists essentially of said differentially thermally growing step.

11. The method of claim 4 wherein said establishing an implant step occurs before said defining a gate electrode step.

12. The method of claim 11 wherein said establishing an implant step occurs before said forming a first gate dielectric step.

13. The method of claim 1, 2 or 3 wherein said defining step includes fully defining the gate electrode.

14. The method according to claim 1, 2 or 10 wherein said method further includes implanting a source or drain region after said anisotropic etching step, and later heat treating the implanted region until one of its edges substantially vertically aligned with the corresponding edge of a gate electrode.

15. The method according to claim 5 further including heat treating the implanted source/drain regions until edges thereof are substantially vertically aligned with corresponding edges of corresponding gate electrodes.

16. The method according to claim 9 further including heat treating said source/drain regions until respective edges thereof substantially vertically align with corresponding edges of corresponding gate electrodes.

17. A method of fabricating, on a substrate, an MOS memory cell having a pair of access gates, a memory gate electrode, and a pair of source/drain regions, comprising:
   (1) providing an isolating layer over the substrate;
   (2) depositing and defining first and second access gates over the isolating layer;
   (3) growing an oxide layer over the tops and sides of the access gates and over the isolating layer such that the oxide over the top and sides of the access gates is relatively thick and the oxide over the isolating layer is relatively thin;
   (4) anisotropically etching the oxide layer and the isolating layer until the substrate is exposed except where covered by the access gates and their underlying isolating layer;
   (5) pattern defining a tunnel oxide, then a memory insulator and then a second oxide over the memory insulator, all between the first and second access gates;
   (6) providing a memory gate electrode over the second oxide;
   (7) providing a third oxide layer over the memory gate, over the oxide on the access gates and on the substrate in the area of intended source/drain regions; and
   (8) implanting and diffusing first and second source/drain regions beneath the third oxide.

18. A method as set forth in claim 17 wherein, between the steps of implanting the source/drain regions and diffusing the same regions, the following steps are included:
   depositing an interlevel dielectric over the structure completed after the step of implanting the source/drain regions;
   defining an etch pattern over at least one of the source/drain regions;
   anisotropically etching down to the substrate the area defined by the etch pattern so that, after the source/drain regions are diffused, contacts may be provided for the areas which were etched.

19. A method as set forth in claim 18 wherein the etch pattern is such that the etching occurs down to the substrate over the first source/drain region and down to the oxide over an adjacent portion of the first access gate, and including depositing a metal pattern which makes contact with the areas which were etched, whereby the metal contact for the first source/drain region overlaps the first access gate.

20. The method according to claim 17, 18 or 19 wherein said diffusing step brings edges of said source/drain regions into substantial vertical alignment with corresponding edges of corresponding gate electrodes.

21. A method of fabricating a memory cell structure on a substrate, comprising:

(1) establishing a distinct arsenic implant region in the substrate for a memory cell capacitor; then
(2) forming a first gate oxide over the substrate and the arsenic implant so as to form a memory cell capacitor; then
(3) defining a first gate electrode over the gate oxide; then
(4) differentially thermally growing an insulating oxide over the structure formed in steps 1–3 such that the insulating oxide is relatively thick on the tops and sides of the first gate electrode and relatively thin over the gate oxide; then
(5) anisotropically etching the structure formed in steps 1–4 so as to remove the insulating oxide and the gate oxide from the substrate and leaving at least a substantial portion of the insulating oxide on the top and sides of the first gate electrode; then
(6) establishing a second gate oxide over the etched portion of the substrate;
(7) defining an interconnect over the insulating oxide and over the first gate electrode;
(8) defining a second gate electrode over the second gate oxide; and
(9) implanting source/drain regions in the substrate to form an access transistor for the memory cell capacitor.

22. The method according to claim 21 wherein the implanted source/drain regions are heat treated until respective edges thereof are substantially vertically aligned with corresponding edges of corresponding gate electrodes.

23. A method of forming a CCD structure on a substrate, comprising:
   (1) establishing a first gate oxide on the substrate;
   (2) defining a first gate electrode on the first gate oxide;
   (3) thermally growing a first insulating oxide over the structure formed in steps 1 and 2 such that the insulating oxide on the sides and top of the gate electrode is relatively thick and the insulating oxide on the first gate oxide is relatively thin; then
   (4) anisotropically etching the structure formed in steps 1–3 so as to remove oxides over the substrate and substantially retain insulating oxide on the top and sides of the first gate electrode;
   (5) growing a second gate oxide over the bare substrate;
   (6) defining a second gate electrode over the second gate oxide such that the latter electrode overlaps the first gate electrode;
   (7) thermally growing a second insulating oxide over the previously formed structure such that the second insulating oxide is relatively thick over the top and sides of the second gate electrode and relatively thin over second gate oxide; then
   (8) anisotropically etching the structure thus formed to lay bare the substrate covered by the second gate oxide; and
   (9) providing additional gate oxides, overlapping gate electrodes and insulating layers as set forth in steps 5 through 7.

* * * * *

UNITED STATES PATENT AND TRADEMARK OFFICE
CERTIFICATE OF CORRECTION

PATENT NO. : 4,397,077
DATED : August, 9, 1983
INVENTOR(S) : Derbenwick et al.

It is certified that error appears in the above-identified patent and that said Letters Patent are hereby corrected as shown below:

In Claim 23, at Column 10 line 58, after "gate oxide," insert --and the second insulating oxide--.

Signed and Sealed this

Fourth Day of October 1983

[SEAL]

Attest:

GERALD J. MOSSINGHOFF

Attesting Officer

Commissioner of Patents and Trademarks